United States Patent [19]

Minami

[11] 4,252,840
[45] Feb. 24, 1981

[54] METHOD OF MANUFACTURING A SEMICONDUCTOR DEVICE

[75] Inventor: Kenji Minami, Kawasaki, Japan

[73] Assignee: Tokyo Shibaura Electric Co., Ltd., Japan

[21] Appl. No.: 857,762

[22] Filed: Dec. 5, 1977

[30] Foreign Application Priority Data

Dec. 6, 1976 [JP] Japan .................... 51-146343

[51] Int. Cl.³ .................................... B05D 5/12
[52] U.S. Cl. .................................... 427/91; 427/88; 156/657; 204/15; 357/71; 357/54; 357/55; 357/23; 29/571; 29/579
[58] Field of Search ........... 29/577, 579, 590, 591, 29/625, 628; 204/15, 129.65, 192 EC, 192 E; 156/653, 657, 659; 427/90, 93, 88, 89; 357/54, 23, 55

[56] References Cited

U.S. PATENT DOCUMENTS

| 3,597,834 | 8/1971 | Lathrop | 29/628 R X |
|---|---|---|---|
| 3,635,774 | 1/1972 | Ohta | 156/653 |
| 3,675,313 | 7/1972 | Driver et al. | 357/23 X |
| 3,764,423 | 10/1973 | Hauser, Jr. et al. | 156/653 |
| 3,764,865 | 10/1973 | Napoli et al. | 357/55 |
| 3,767,492 | 10/1973 | Macrae et al. | 204/192 E X |
| 3,795,557 | 3/1974 | Jacob | 156/646 |
| 3,808,069 | 4/1974 | Caffrey | 156/657 X |
| 3,822,467 | 7/1974 | Symersky | 29/591 X |
| 3,837,907 | 9/1974 | Berglund et al. | 427/93 |
| 3,871,931 | 3/1975 | Godber | 156/659 |
| 3,874,918 | 4/1975 | Nechtow et al. | 427/88 X |
| 3,880,684 | 4/1975 | Abe | 204/192 X |
| 3,898,353 | 8/1975 | Napoli et al. | 357/55 X |
| 3,920,861 | 11/1975 | Dean | 357/23 X |
| 3,940,506 | 2/1976 | Heinecke | 204/192 EC X |
| 3,971,683 | 7/1976 | Briska | 156/657 X |
| 3,979,241 | 9/1976 | Maeda | 156/657 |
| 4,074,300 | 2/1978 | Sakai et al. | 357/23 |
| 4,075,652 | 2/1978 | Umebachi et al. | 357/55 X |

OTHER PUBLICATIONS

IBM Tech. Discl. Bull., vol. 17, No. 11, Apr. 1975, p. 3280.
IBM Tech. Discl. Bull., vol. 21, No. 4, Sep. 1978, p. 1369.

Primary Examiner—Francis S. Husar
Assistant Examiner—C. J. Arbes
Attorney, Agent, or Firm—Finnegan, Henderson, Farabow, Garrett & Dunner

[57] ABSTRACT

A method of manufacturing a semiconductor device which comprises the steps of forming an insulating layer on a semiconductor substrate; removing that region of the insulating layer which is to be used for an electrode contact spot, thereby forming a hole for electrode contact, removing that region of the insulating layer on which wiring is to be laid to the intermediate section of the thickness of said insulating layer, thereby providing a stepped section between the bottom of the specified wiring region of said insulating layer thus removed and the surface of said insulating layer; and depositing a metal layer all over the surface of the insulating layer and then cutting off at said stepped section the portion of the metal layer formed on the specified wiring region of said insulating layer from the other portions of the metal layer remaining on the surface of the insulating layer, thereby providing the prescribed wiring.

9 Claims, 13 Drawing Figures

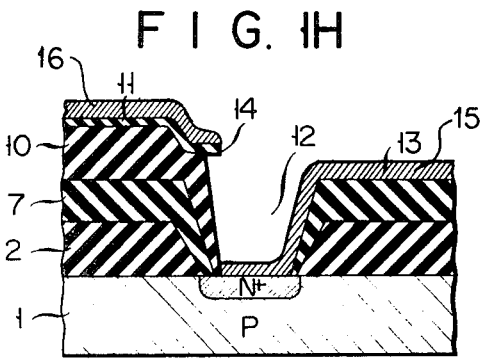
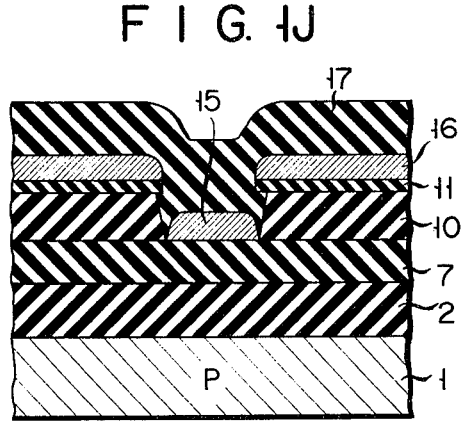
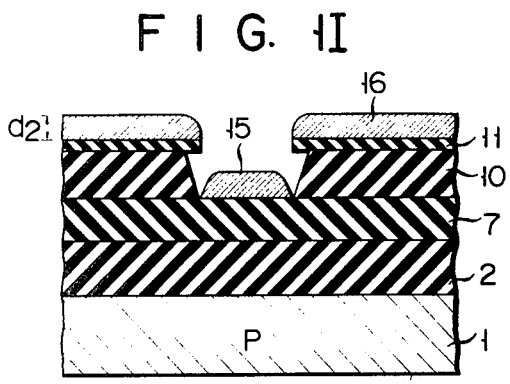
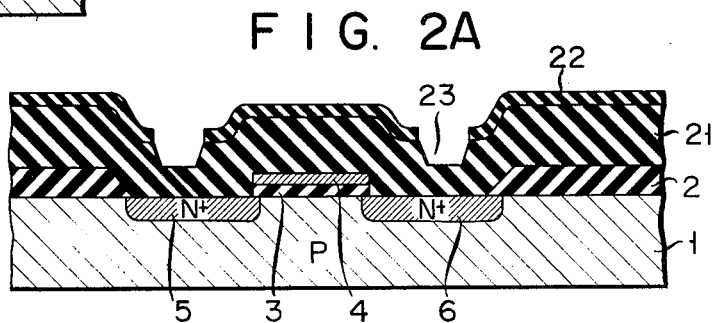
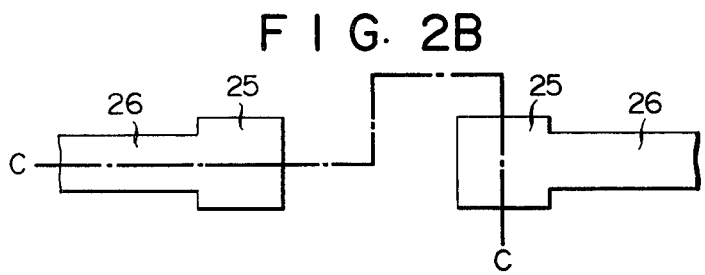
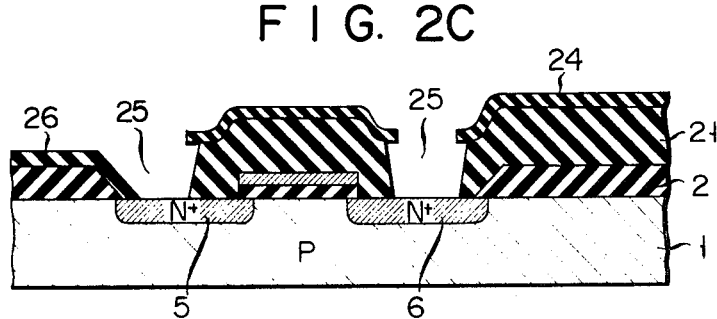

METHOD OF MANUFACTURING A SEMICONDUCTOR DEVICE

BACKGROUND OF THE INVENTION

This invention relates to a method of manufacturing a semiconductor device and more particularly to a method of forming metal wiring for an integrated semiconductor circuit.

A method of forming metal wiring, for example, aluminium wiring for an integrated semiconductor circuit generally comprises the steps of forming an electrode contact hole in an insulating layer deposited on a semiconductor substrate by photoetching technique, thermally depositing an aluminium layer all over the insulating layer and patterning the aluminium layer by photoetching technique. However, the above-mentioned customary process of forming, for example, aluminium wiring had the drawbacks that since photoetching was carried out twice, high integration of a semiconductor circuit was obstructed; difficulties arose in projecting light for the patterning of an aluminium layer by photoetching; occurrence of etching residue of aluminium decreased the yield of a semiconductor device produced; and since little consideration was given to the shielding of an integrated semiconductor circuit manufactured by the prior art process, said circuit was readily affected by not only external but also internal noises.

SUMMARY OF THE INVENTION

It is accordingly the object of this invention to provide a method of manufacturing a semiconductor device with good yield and in the highly integrated form.

According to an aspect of this invention, there is provided a method of manufacturing a semiconductor device which comprises the steps of forming an insulating layer on a semiconductor substrate; removing that region of the insulating layer which is to be used for an electrode contact spot, thereby forming a hole for electrode contact, removing that region of the insulating layer on which wiring is to be laid to the intermediate section of the thickness of said insulating layer, thereby providing a stepped section between the bottom of the specified wiring region of said insulating layer thus removed and the surface of said insulating layer; and depositing a metal layer all over the surface of the insulating layer and then cutting off at said stepped section the portion of the metal layer formed on the specified wiring region of said insulating layer from the other portions of the metal layer remaining on the surface of the insulating layer, thereby providing the prescribed wiring.

BRIEF DESCRIPTION OF THE DRAWINGS

FIGS. 1A to 1J illustrate the sequential steps of manufacturing a semiconductor device according to one embodiment of this invention; and FIGS. 2A to 2C show the sequential steps of manufacturing a semiconductor device according to another embodiment of the invention.

DETAILED DESCRIPTION OF THE PREFERRED EMBODIMENTS

There will now be described by reference to the accompanying drawings a method of manufacturing a semiconductor device according to one embodiment of this invention.

Figure 1A:
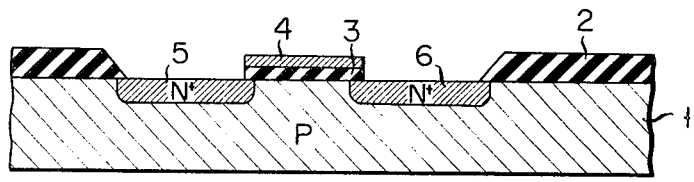

Referring to FIG. 1A, the surface of a P-conductivity type silicon substrate 1 is thermally oxidized, followed by photoetching, to form a field oxide layer 2 with a thickness of, for example, one micron. Next, a dry $O_2$ gas at 1,000° C. is blown on said field oxide layer 2 to form an oxide layer having a thickness of, for example, 1,000 Å. A polycrystalline silicon layer is thermally deposited on said oxide layer. The succeeding patterning by photoetching provides a gate oxide layer 3 and a gate electrode 4 formed of polycrystalline silicon. A source region 5 and drain region 6 are formed by injecting an N-type impurity in the exposed portions of the substrate 1.

Figure 1B:
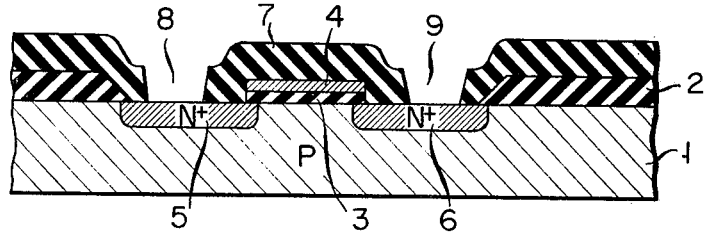
Figure 1C:
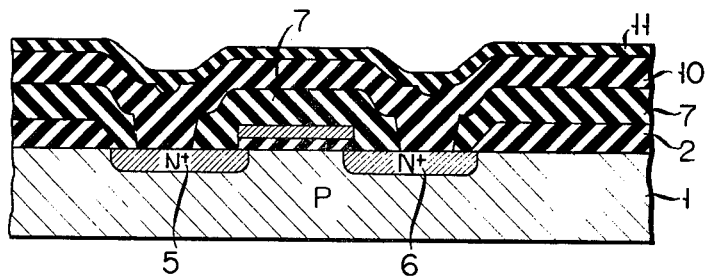

Thereafter, as shown in FIG. 1B, a first oxide insulating layer 7 is formed by a vapor growth method at a temperature of, for example, 500° C. Holes 8, 9 are bored by photoetching in those portions of the oxide insulating layer 7 which face the source region 5 and drain region 6. The oxide insulating layer 7 is chosen to have a thickness of, for example, 1.2 microns (said thickness being preferred to range between 0.7 and 1.3 microns). This oxide insulating layer 7 is etched by ammonium fluoride at room temperature at the rate of, for example, 1,200 Å/min (said rate being preferred to range from 1,000 to 1,500 Å/min). A second insulating layer 10 is formed, as shown in FIG. 1C, on the first oxide insulating layer 7 to fill up the holes 8, 9. Further, a third insulating layer 11 is deposited on said second insulating layer 10. The second insulating layer 10 is formed of, for example, phosphorus glass by the vapor growth method at 500° C. This second insulating layer 10 is chosen to have a thickness of, for example, 8,000 Å (said thickness being preferred to range between 7,000 and 10,000 Å), and also to be etched at the rate of, for example, 1,500 Å/min (said rate being preferred to range from 1,500 to 1,800 Å/min). The third insulating layer 11 is prepared from, for example, $Si_3N_4$ by the vapor growth method at 800° C. This third insulating layer 11 is chosen to have a thickness of, for example, 1,500 Å (said thickness being preferred to range between 0.05 and 0.2 micron), and to be etched at an extremely slower rate (or at a substantially zero rate) than the first insulating layer 7 and second insulating layer 10. The above-mentioned etching rates were all measured when an etchant of ammonium fluoride ($NH_4F$) was applied at room temperature (25° C.). For satisfactory setting of wiring on the gate, it is preferred to etch the first insulating layer 7 at a slower rate than the second insulating layer 10. To prevent the breakage of wiring at the stepped section of the electrode contact hole, however, the first insulating layer 7 should preferably be etched at substantially the same rate as the second insulating layer 10. That is, the first insulating layer 7 should preferably be etched at substantially the same as, or at a slightly slower rate, than the second insulating layer 10. The third insulating layer 11 has to be etched at a slower rate than the first insulating layer 7 and second insulating layer 10.

Figure 1D:
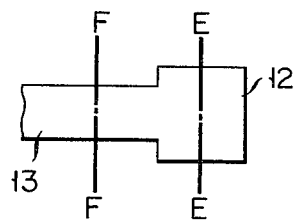
Figure 1E:
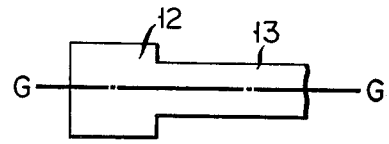

The second and third insulating layers 10, 11 constructed as shown in FIG. 1C are photoetched by means of a combination of a patterned mask for boring an electrode contact hole and a patterned mask for forming wiring. Where the second and third insulating layers 10, 11 cannot be etched by a common etchant, different etchants adapted for said layers are applied. For example, the third insulating layer 11 is first etched by a plasma gas of CF$_4$ series and then the second layer 10 is etched by NH$_4$F for about 8 minutes at 25° C. In this case, the first insulating layer 7 may permissibly be etched somewhat. Then the first insulating layer 7 thus etched will have a thickness of about 0.8 micron. Through the above-mentioned steps, the second and third insulating layers 10, 11 are etched as illustrated in the plan views of FIGS. 1D and 1E, thereby providing the prescribed wiring region at the same time as when the electrode contact hole 12 is formed.

Figure 1F:
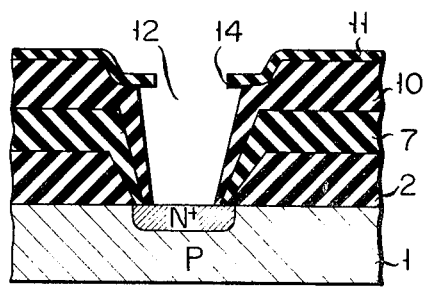
Figure 1G:
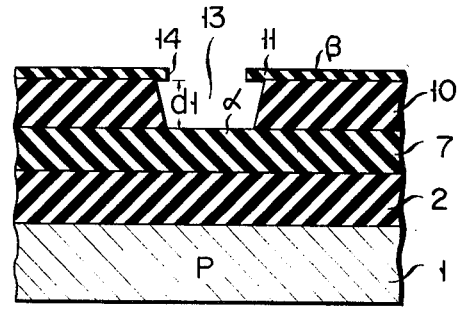

After patterning, the proximity of the electrode contact hole indicates such a cross section as shown in FIGS. 1F, 1G and 1H. FIG. 1F is a sectional view on line E—E of FIG. 1D; FIG. 1G is a sectional view on line F—F of FIG. 1D; and FIG. 1H is a sectional view on line G—G of FIG. 1E. As seen from FIGS. 1F to 1H, an eaves-like projection 14 of the third insulating layer 11 is formed on the shoulder sections of the electrode contact hole 12 and prescribed wiring region 13. This eaves-like projection 14 is formed, because the third insulating layer 11 is etched at a slower rate than the second insulating layer 10. The prescribed wiring region 13 is made into a trough shape as shown in FIG. 1G. As used herein, the bottom of said trough is referred to as an $\alpha$ stage, and the surface of the third insulating layer 11 as a $\beta$ stage.

A aluminium layer 16 is deposited by evaporation or sputtering as shown in FIG. 1I. In this case, the aluminium layer is purposely broken by the stepped section defined by the $\alpha$ and $\beta$ stages as well as by the eaves-like projection 14. Thus, an aluminium wiring layer 15 and an aluminium shielding layer 16 discontinuous from the wiring layer are produced at the same time. A contact electrode is formed in the electrode contact hole 12 at the same time as and continuous with the aluminium wiring layer 15 as shown in FIG. 1H. The aluminium shielding layer 16 can be applied as shielding. To separate the aluminium layer, the height $d_1$ of the stepped section defined by the $\alpha$ and $\beta$ stages should be made larger than the thickness $d_2$ of the aluminium wiring layer 15. With the foregoing embodiment, where the aluminium wiring layer 15 is chosen to have a thickness $d_2$ of, for example, 0.6 micron, then the stepped section has a height $d_1$ of about 1 micron, thereby enabling the aluminium shielding layer 16 to be easily separated from the aluminium wiring layer 15.

Finally as shown in FIG. 1J, a protective membrane 17 is preferred from, for example, phosphorus glass with a thickness of 1.0 micron by the vapor growth method. The protective membrane 17 is photoetched in a bonding pad section (not shown) formed at the same time and by the same process as the aluminium wiring layer 15. If, in addition to the bonding pad, another pad is formed to determine the level of voltage impressed on the aluminium shielding layer 16 deposited on the $\beta$ stage when said shielding aluminium layer 16 is produced, then an integrated semiconductor circuit is effectively shielded and the other portions of said circuit than the wiring section can be prevented from being unnecessarily charged. In this case, the dielectric breakdown voltage $V_{ins}$ of the protective membrane 17 across the $\beta$ and $\alpha$ stages should be higher than the power source voltage $V_{sup}$. Further, the field inversion voltage $V_{th}$ should also be higher than the power source voltage $V_{sup}$.

According to the method of this invention of manufacturing a semiconductor device, a wiring layer and electrode contact hole are formed at the same time by photoetching, enabling the wiring to be provided in the form assuring self-alignment. Since any extra photoetching is not needed for the construction of the wiring, the yield of a semiconductor device is elevated. The aluminium shielding layer 16 formed at the same time as the wiring improves the reliability of a semiconductor device produced.

With the foregoing embodiment, the third insulating layer 11 is provided to ensure the separation of the aluminium wiring layer 15 from the aluminium shielding layer 16. Where, however, boron is subjected by diffusion or ion implantation in the proximity of the surface of the second insulating layer 10 prepared from, for example, phosphorus glass, then the surface of the second insulating layer 10 is etched at a slow rate, providing a eaves-like projection as when the third insulating layer 11 is formed in the above-mentioned embodiment. Therefore, formation of said third insulating layer 11 can be omitted.

Further, in the preceding embodiment, the aluminium wiring layer 15 was separated from the shielding aluminium layer 16 by the eaves-like projection 14 and the stepped section having a height of $d_1$. Where, however, the stepped section has a sufficiently large height $d_1$, then the aluminium wiring layer 15 will be separated from the shielding aluminium layer 16 even in the absence of the eaves-like projection 14. In the aforesaid embodiment, the aluminium shielding layer 16 was formed to ensure the effect of shielding. However, said aluminium shielding layer 16 may be removed by the lift-off method.

In this case, the eaves-like projection 14 can be formed by photoetching through a removable photoresist, instead of providing the third insulating layer 11, thereby elevating the yield of a semiconductor device.

In said embodiment, the second insulating layer 10 was formed in order to prevent the first insulating layer 7 on the gate electrode 4 from being taken off. However, formation of said second insulating layer 10 may be omitted by applying the following process. Namely, as shown in FIG. 2A, an insulating layer 21 corresponding to the first insulating layer 7 of FIG. 1B is formed. This insulating layer 21 is photoetched by means of a photoresist 22 down to the intermediate section of the thickness of said insulating layer 21 to provide a hole 23. After removing the photoresist 22, an insulating layer 24 corresponding to the third insulating layer 11 of FIG. 1C, is deposited, as shown in FIG. 2C. Thereafter, the insulating layers 21, 24 are photoetched, as in the preceding embodiment, through a photomask formed of a combination of a patterned mask for boring the electrode contact hole and a patterned mask for providing wiring, thereby simultaneously forming an electrode contact hole 25 and the specified wiring region 26. Subsequently, the steps of FIGS. 1I and 1H are taken. In this case, the aluminium shielding layer 16 may or may not be removed. Or only the required portion of said aluminium shielding layer 16 may be retained.

What is claimed is:

1. A method of manufacturing a semiconductor device which comprises the steps of forming an insulating layer on a semiconductor substrate; removing that portion of the insulating layer which is to be used for an electrode contact spot, thereby forming a contact hole; removing to an intermediate thickness that region of the insulating layer on which wiring is to be laid, thereby providing a step section between the bottom of the specified wiring region of said insulating layer thus removed and the top surface of said insulating layer; and depositing a metal layer onto the top surface of said insulating layer and in said contact hole and said wiring region, the metal layer deposited on the top surface of said insulating layer being separated from the metal layer deposited in said contact hole and in said wiring region, the metal layer deposited in said contact hole and in said wiring region being continuous.

2. The method according to claim 1, which further comprises the step of removing at least part of the metal layer deposited on the top surface of the insulating layer.

3. The method according to claim 1 including selectively etching the insulating layer through a mask formed of a combination of a patterned mask for boring an electrode contact hole and a patterned mask for forming wiring regions.

4. The method according to claim 1 including forming the insulating layer of an inner layer and an outer layer, and etching the outer layer at a slower rate than the inner layer such that the etched outer layer of the insulating layer projects in the form of eaves over the cavity formed by etching the insulating layer.

5. The method according to claim 4, including introducing an impurity into the outer layer of the insulating layer to cause it to be etched at a slower rate.

6. The method according to claim 1, including forming the insulating layer of an inner layer bored with a hole by etching said insulating layer down to the intermediate section of the thickness thereof and an outer layer; and etching the outer layer at a slower rate than the inner layer, thereby causing said outer layer to project in the form of eaves at the shoulder section of a cavity bored by selective etching of the insulating layer.

7. The method according to claim 6, including forming the inner layer of the insulating layer of $SiO_2$ film and preparing the outer layer thereof from $Si_3N_4$ film.

8. The method according to claim 2 including forming the insulating layer of an inner layer bored with a hole for contact with an electrode, an intermediate layer covering said electrode contact hole and an outer layer; etching the outer layer of said insulating layer at a slower rate than the intermediate layer thereof; etching the intermediate layer at the same rate as, or at a slightly faster rate than, the inner layer thereof; and selectively etching the intermediate and outer layers of the insulating layer, thereby causing the outer layer to project in the form of eaves at the shoulder section of a cavity bored by said selective etching.

9. The method according to claim 8, including forming the inner layer of the insulating layer of $SiO_2$ film, preparing the intermediate layer thereof from phosphorus glass, and making the outer layer thereof of $Si_3N_4$ film.

* * * * *